United States Patent [19]

Takane et al.

[11] Patent Number: 5,189,369
[45] Date of Patent: Feb. 23, 1993

[54] NMR IMAGING METHOD OF LOW FLOW RATE FLUID

[75] Inventors: Atsushi Takane; Hideaki Koizumi, both of Katsuta; Koichi Sano, Yokohama, all of Japan

[73] Assignee: Hitachi, Ltd., Tokyo, Japan

[21] Appl. No.: 671,091

[22] Filed: Mar. 18, 1991

[30] Foreign Application Priority Data

Mar. 19, 1990 [JP] Japan ................................ 2-67135

[51] Int. Cl.$^5$ .......................................... G01R 33/20
[52] U.S. Cl. .................................. 324/306; 324/307
[58] Field of Search ............... 324/300, 307, 309, 310, 324/311, 312, 313, 318, 322; 128/653.2, 653.5, 653.3

[56] References Cited

U.S. PATENT DOCUMENTS

| | | | |
|---|---|---|---|
| 4,165,479 | 8/1979 | Mansfield | 324/313 |
| 4,639,671 | 1/1987 | Macovski | 324/309 |
| 4,665,366 | 5/1987 | Macovski | 324/306 |
| 4,707,658 | 11/1987 | Frahm et al. | 324/309 |
| 4,716,367 | 12/1987 | Patz | 324/309 |
| 4,788,500 | 11/1988 | Patz et al. | 324/309 |
| 4,973,906 | 11/1990 | Bernstein | 324/309 |
| 4,982,161 | 1/1991 | Twieg | 324/309 |

OTHER PUBLICATIONS

Medical Imaging MI-5, No. 3, pp. 140-151, 1986.
Magnetic Resonance in Medicine 6, pp. 224-234, 1988.
Magnetic Resonance in Medicine 7, pp. 35-42, 1988.
Journal of Magnetic Resonance 62, pp. 12-18, 1985.
Magnetic Resonance in Medicine 4, pp. 9-23, 1987.
Magnetic Resonance in Medicine 3, pp. 140-145, 1986.
Magnetic Resonance in Medicine 10, pp. 324-337, 1988.
Magnetic Resonance in Medicine 14, pp. 222-229, 1990.

*Primary Examiner*—Michael J. Tokar
*Attorney, Agent, or Firm*—Antonelli, Terry, Stout & Kraus

[57] ABSTRACT

An NMR imaging method of low flow rate fluid by measuring a time-reversed FID signal in a steady state free precession (SSFP) state comprises the steps of imaging in a dephase sequence, a rephase sequence or both of them, and processing the resulting image data by a maximum intensity projection method, a minimum intensity projection method or an image subtraction method to extract image data of fluid.

9 Claims, 9 Drawing Sheets

VELOCITY DISTRIBUTION OF BLOOD IN BLOOD VESSEL

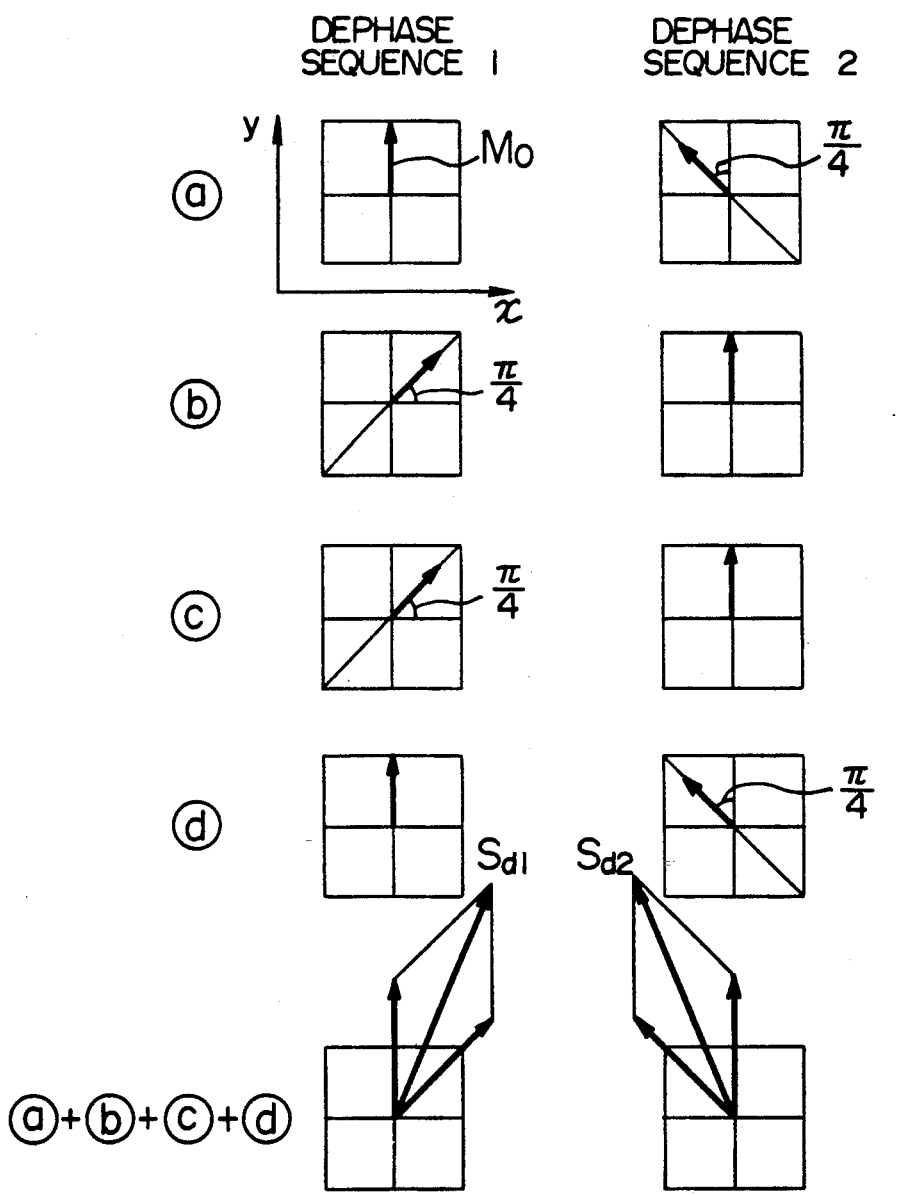

FIG. 6
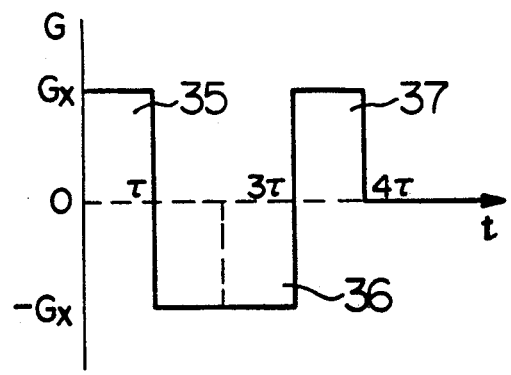
FIG. 7
| | DEPHASE SEQUENCE | REPHASE SEQUENCE |
|---|---|---|
| ⓐ | 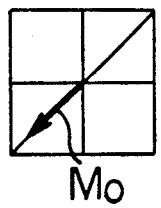 |  |
| ⓑ | 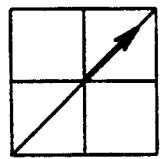 | 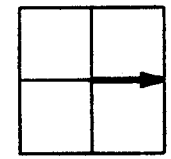 |
| ⓒ | 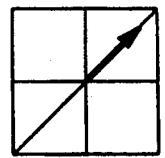 | 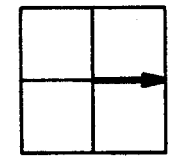 |
| ⓓ | 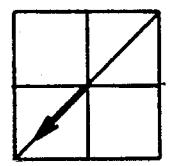 | 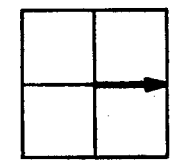 |
| ⓐ+ⓑ+ⓒ+ⓓ | 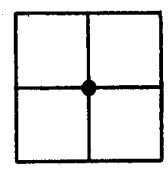 | 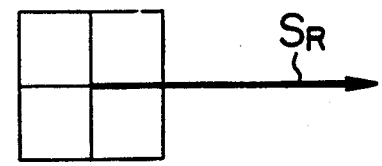 |

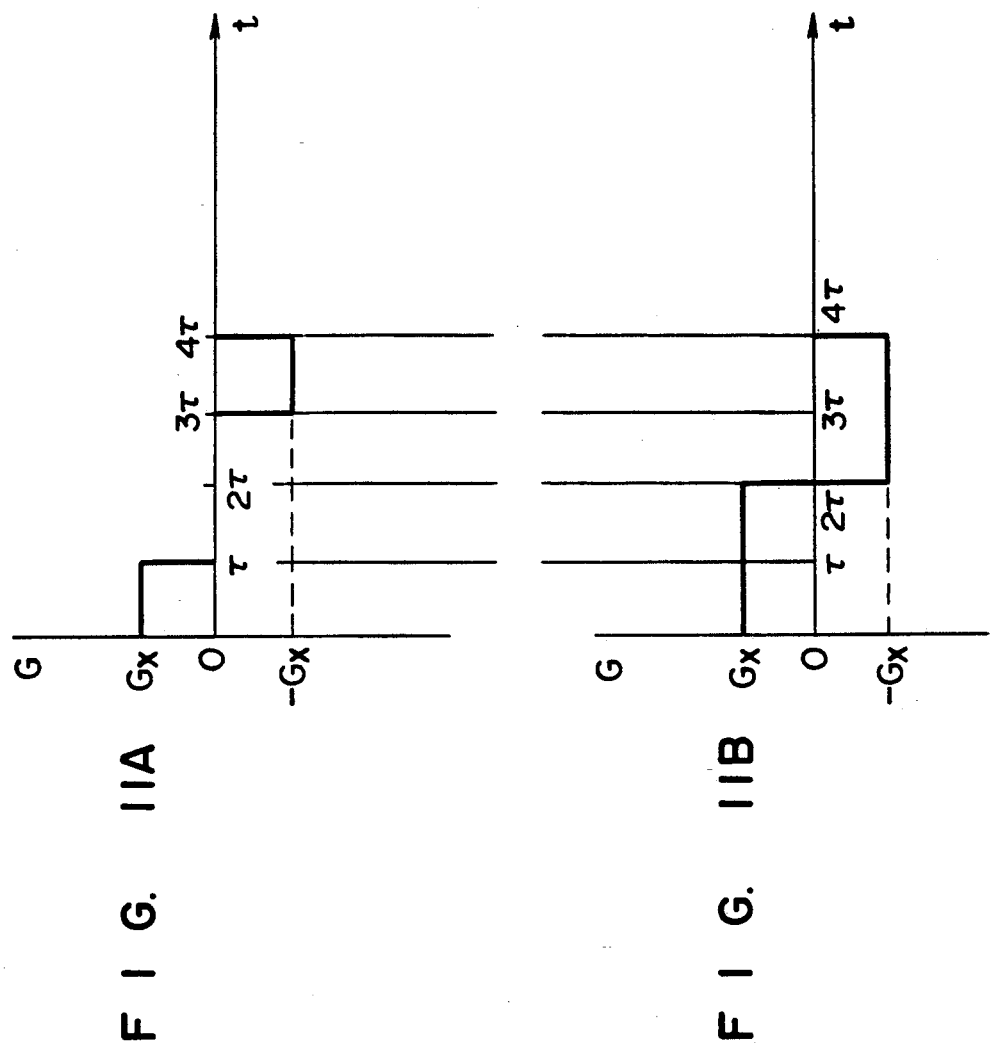

NMR IMAGING METHOD OF LOW FLOW RATE FLUID

BACKGROUND OF THE INVENTION

The present invention relates to an imaging method which is effective in rapidly imaging low flow rate fluid in a human body by a dislocation imaging device which utilizes nuclear magnetic resonance phenomenon (hereinafter referred to as MRI).

The following articles 1) to 9) disclose the technologies relating to the present invention.
1) IEEE Trans. on Medical Imaging, MI-5, No. 3, pp. 140-151, 1986.
2) Magnetic Resonance in Medicine 6, 274-234, 1988.
3) Magnetic Resonance in Medicine 7, 35-42, 1988.
4) Journal of Magnetic Resonance 62, 12-18, 1985.
5) Magnetic Resonance in Medicine 3, 140-145, 1986.
6) Magnetic Resonance in Medicine 4, 9-23, 1987.
7) Magnetic Resonance in Medicine 10, 324-337, 1989.
8) U.S. Pat. No. 4,788,500.
9) Magnetic Resonance in Medicine 14, 222-229, 1990.

A prior art method for imaging fluid in the NMR imaging is discussed in detail in the reference 1). A principle of selection of blood flow utilizes a gradient magnetic field pulse which causes a change in a phase by flow or movement, which is called a flow encode pulse. Where the flow encode pulse is present along the direction of flow of the blood flow, a change of phase is produced in an excited spin in the blood flow in accordance with a flow rate. By subtracting between two images reconfigured based on NMR signals (hereinafter referred to as signals) detected in a dephase sequence which includes the flow encode pulse and a rephase sequence which does not include the flow encode pulse, image data of only the blood flow can be detected. A principle thereof is as follows. The blood flow in a blood vessel is a laminar flow which is of high flow rate at a center and of low flow rate at a periphery. Accordingly, when it is imaged by the dephase sequence, the excited spin has different phase change depending on a distance from the center of the blood vessel. As a result, signal data projected on a plane parallel to the blood flow has random orientation of the phases of the spins and resultant vectors cancel each other so that no signal is produced from the blood vessel or a signal amplitude is very small. On the other hand, when it is imaged by the rephase sequence, the phases of the spins which have once disturbed are reordered as the blood flows and if the signal is measured at a specific timing, the signal without phase change can be detected. Accordingly, when it is imaged by the rephase process, a signal may be detected even from the blood flow which includes a laminar flow. A signal may be detected from a static area by either one of the sequences, but the signals of the static area are cancelled out by subtracting the images produced by the two sequences so that the signal of only the blood vessel is produced. This method is generally called a subtraction method.

A method for imaging a signal produced in a steady-state free precession is discussed in the references 2) to 4). When an RF pusle is irradiated at an extremely short repetition cycle compared to a relaxation time of the excited spin, the steady state free precession occurs so that the NMR signal is periodically produced in the imaging area in a stable manner, and a free induction decay (FID) signal is produced immediately after the RF pulse and a time-reversed free induction decay signal is produced immediately before the next RF pulse. It is known that the time-reverse FID signal has a similar property to that of an echo signal produced by the RF pulse of the two-preceding stage and the RF pulse of the preceding stage, that is, an echo signal having an echo time (TE) which is double of TR.

For the time-reversed FID signal, the two sequentially applied RF pulses function as a 90° pulse and a 180° pulse in the spin echo pulse sequence. As a result, the RF pulse in the preceding stage functions to invert the phase of the NMR signal produced by the RF pulse of the preceding stage thereof. In this case, a gradient magnetic field is applied such that the phase-inverted signal converges, then diverses and is reconverged.

A method for drawing slow flow rate fluid by utilizing the signal produced in the SSFP state is discussed in the references 5) to 8). Particularly in the reference 8), the method is discussed in detail. It describes that when the time-reversed FID signal produced in the SSFP state is to be detected, the interval of application of the RF pulses, that is, the repetition time is changed or the magnitude of the gradient magnetic field applied to detect the signal is changed to rotate the phase of the excited spin of the fluid so that two images are formed in the two dephase and rephase sequences having different gradient magnetic field magnitudes and the slow flow rate fluid is drawn by the subtraction between those images.

In this case, depending on the degree of the phase change of the spin, a large signal of the fluid may not be produced by the subtraction. This is explained with reference to FIGS. 1 and 2.

FIG. 1 shows a flow rate distribution of the blood flow. Numeral 1 denotes blood and numeral 2 denotes a direction of flow. The flow rate is high at points ⓐ and ⓓ, and low at points ⓑ and ⓒ.

FIG. 2 show the phase rotations at the points ⓐ to ⓓ of FIG. 1 and combined signals of the signals at the points ⓐ to ⓓ in two different phase sequences. Mo represents a magnitude of signal in the SSFP state.

As shown in FIG. 5, when the phases of the resultant signals are in the substantially same direction, a differential signal is very small. In the example shown in FIG. 2, $$|Sd_1 - Sd_2| \approx 2.8 \, Mo$$

Depending on the phase angles of $Sd_1$ and $Sd_2$, the signal is smaller.

In the reference 8), no consideration is paid to a method for drawing slow flow rate fluid based on data derived from measurement in sole dephase sequence or rephase sequence.

A maximum intensity projection method and a minimum intensity projection method in the image processing are discussed in detail in the reference 9). In the maximum intensity projection method, when a two-dimension image projected in any direction is to be produced based on three-dimensionally measured data and data which is three dimensionally measured by two-dimension multi-slice, a projection image is formed by using a maximum intensity pixel of a plurality of pixels of the three-dimension source data as a target pixel. In the minimum intensity projection method, a minimum intensity pixel is used as a target pixel.

SUMMARY OF THE INVENTION

It is an object of the present invention to image low flow rate fluid by using a high speed imaging method.

A most important feature of the present invention resides in the use of the rephase sequence in detecting the time-reversed FID signal produced in the SSFP state, which rephase sequence has not been utilized in the prior art.

In order to achieve the above object, in accordance with the present invention, the time-reversed FID signal is detected in the dephase sequence, the rephase sequence or both of them, and the fluid is imaged in the following three steps.

(a) The minimum intensity projection method is applied to the image data produced in the dephase sequence to sample a low intensity signal as a fluid signal for imaging.

(b) The maximum intensity projection method is applied to the image data produced in the rephase sequence to sample a high intensity signal as a fluid signal for imaging.

(c) Images produced in the dephase sequence and the rephase sequence are subtracted to cancel the static area and sample the fluid for imaging.

BRIEF DESCRIPTION OF THE DRAWINGS

FIG. 2 shows a prior art imaging method of low flow rate fluid,

FIG. 6 shows an application pattern of a rephase gradient magnetic field, FIG. 7 shows an example of phase change observed when a time-reversed FID signal is imaged in the dephase sequence and the rephase sequence.

DESCRIPTION OF THE PREFERRED EMBODIMENTS

Figure 3:
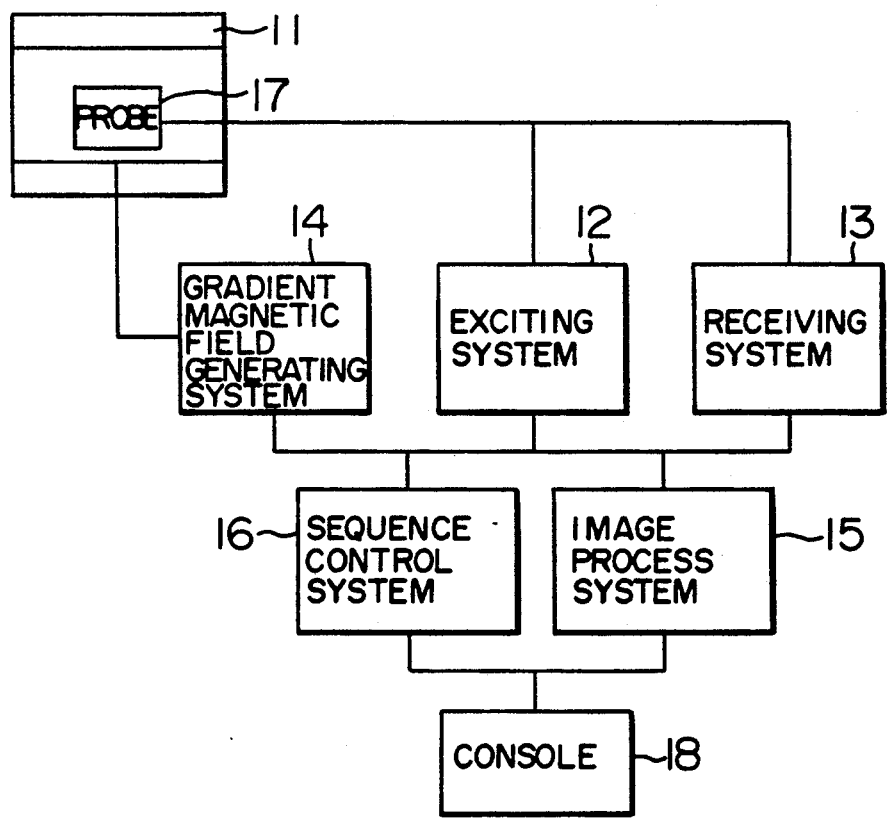
FIG. 3 shows a configuration of an MRI device which implements the imaging method of the present invention.

The preferred embodiments of the present invention will now be explained in detail with reference to the accompanying drawings. FIG. 3 shows a block diagram of an MRI device which implements the imaging method of the present invention. In FIG. 3, numeral 11 denotes a magnet which generates a uniform static magnetic field, numeral 12 denotes an exciting system for generating an RF magnetic field to cause nuclear magnetic resonance in an object, numeral 13 denotes a receiving system for receiving, detecting and A/D-converting an electromagnetic wave generated by the object, numeral 14 denotes a gradient magnetic field generating system capable of independently and linearly changing the intensities of magnetic field in X, Y and Z directions, numeral 15 denotes an image processing system for processing image based on measurement data from a measuring system in order to reproduce an image, numeral 16 denotes a sequence control system for controlling the operation timings of the respective systems, numeral 17 denotes a probe for transmitting and receiving the RF wave, and numeral 18 denotes a console for the operation.

Figure 4:
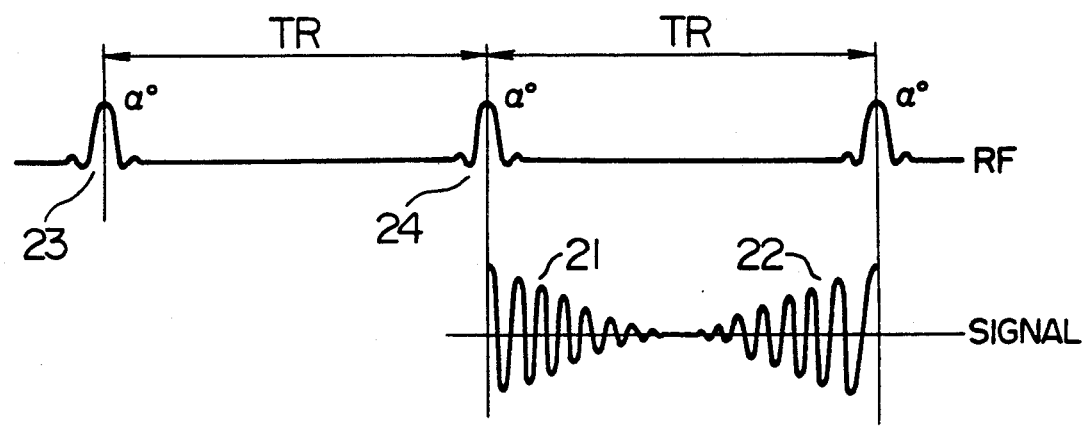
FIG. 4 illustrates a signal produced in the SSFP state.

FIG. 4 shows a signal produced in the SSFP state. Numeral 21 denotes an FID signal which is produced immediately after the RF pulse, and numeral 22 denotes a time-reversed FID signal which is produced immediately before the RF pulse. It is known that the time-reversed FID signal has a similar property to that of an echo signal produced by a two-preceding RF pulse 23 and a preceding RF pulse 24, that is, the echo signal having an echo time TE which is double of TR. The phase of the NMR signal excited by the RF pulse 23 is inverted by the RF pulse 24 so that the phase is again in phase and it becomes the time-reversed FID signal 22.

Figure 5A:
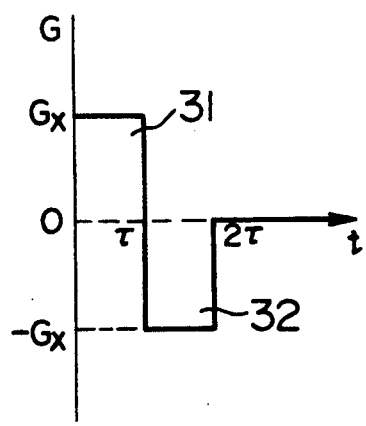
FIGS. 5A and 5B show application patterns of a dephase gradient magnetic field.
Figure 5B:
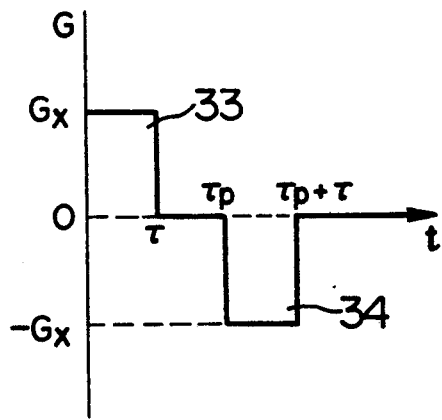

FIGS. 5A, 5B and 6 show application patterns of the gradient magnetic field which is the principle of the present invention.

FIGS. 5A and 5B show the application patterns of the dephase gradient magnetic field which causes the phase rotation in the spin of the fluid. They are called flow encode pulses. Numerals 31 and 32, and numerals 33 and 34 denote gradient magnetic fields of equal application duration and opposite output values. The phase rotation $\theta$ of the fluid to which the gradient magnetic field shown in FIG. 5A is applied is represented by $$\theta = \int_0^{2\tau} \gamma G_x X(t) dt = -\gamma G_x V \tau^2 \quad (1)$$

where V is the velocity of the fluid, $\gamma$ is a magnetic rotation ratio, $G_x$ is a gradient magnetic field intensity and $X(t) = X_0 + Vt$.

The phase rotation $\theta$ of the spin to which the gradient magnetic field shown in FIG. 5B is applied is represented by $$\theta = \int_0^{\tau_p + \tau} \gamma G_x X(t) dt = -\gamma G_x V \cdot \tau \cdot \tau_p \quad (2)$$

FIG. 6 shows an application pattern of the rephase gradient magnetic field which compensates for the phase rotation of the spin. It takes a form of continuation of the two pulses, the flow encode pulse of FIG. 5A and the reversal of the flow encode pulse of FIG. 5A. The phase rotation of the fluid to which the above gradient magnetic field is applied is zero.

$$\theta = \int_0^{4\tau} \gamma G_x X(t) dt = 0 \quad (3)$$

Figure 1:
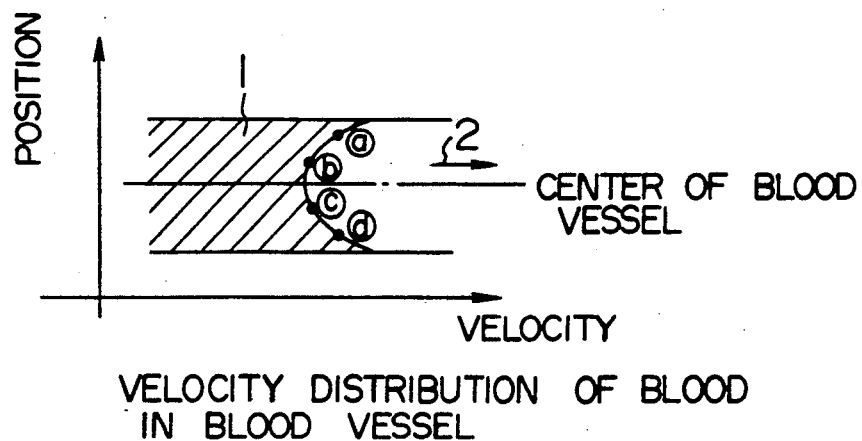
FIG. 1 shows a velocity distribution of blood flow in a blood vessel.

FIG. 7 shows an example of change of phase of the spin at a position in the blood vessel when the time-reversed FID signal is imaged in the dephase sequence and the rephase sequence. In FIG. 7, ⓐ to ⓓ correspond to ⓐ-ⓓ in FIG. 1, and ⓐ+ⓑ+ⓒ+ⓓ represents a combined signal.

Comparing it to FIG. 2, the differentiation of the image data produced by imaging in the dephase sequence and the rephase sequence enables the sampling of a stable and large signal.

In the example of FIG. 7, the subtraction between the two images results in $$S_R = 4Mo$$

where Mo is same as that in FIG. 2.

Figure 8:
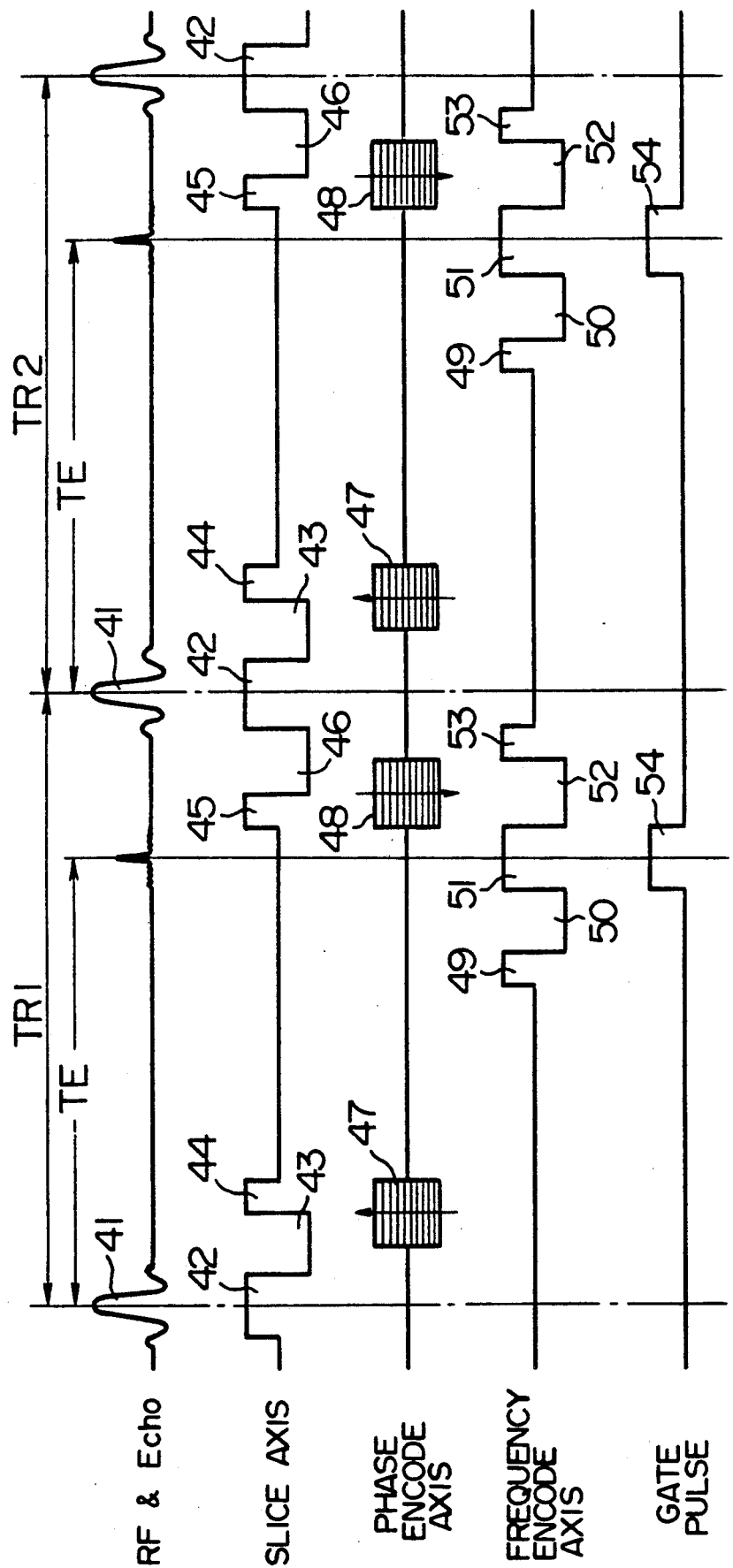
FIG. 8 shows the rephase sequence in the present invention.
Figure 9:
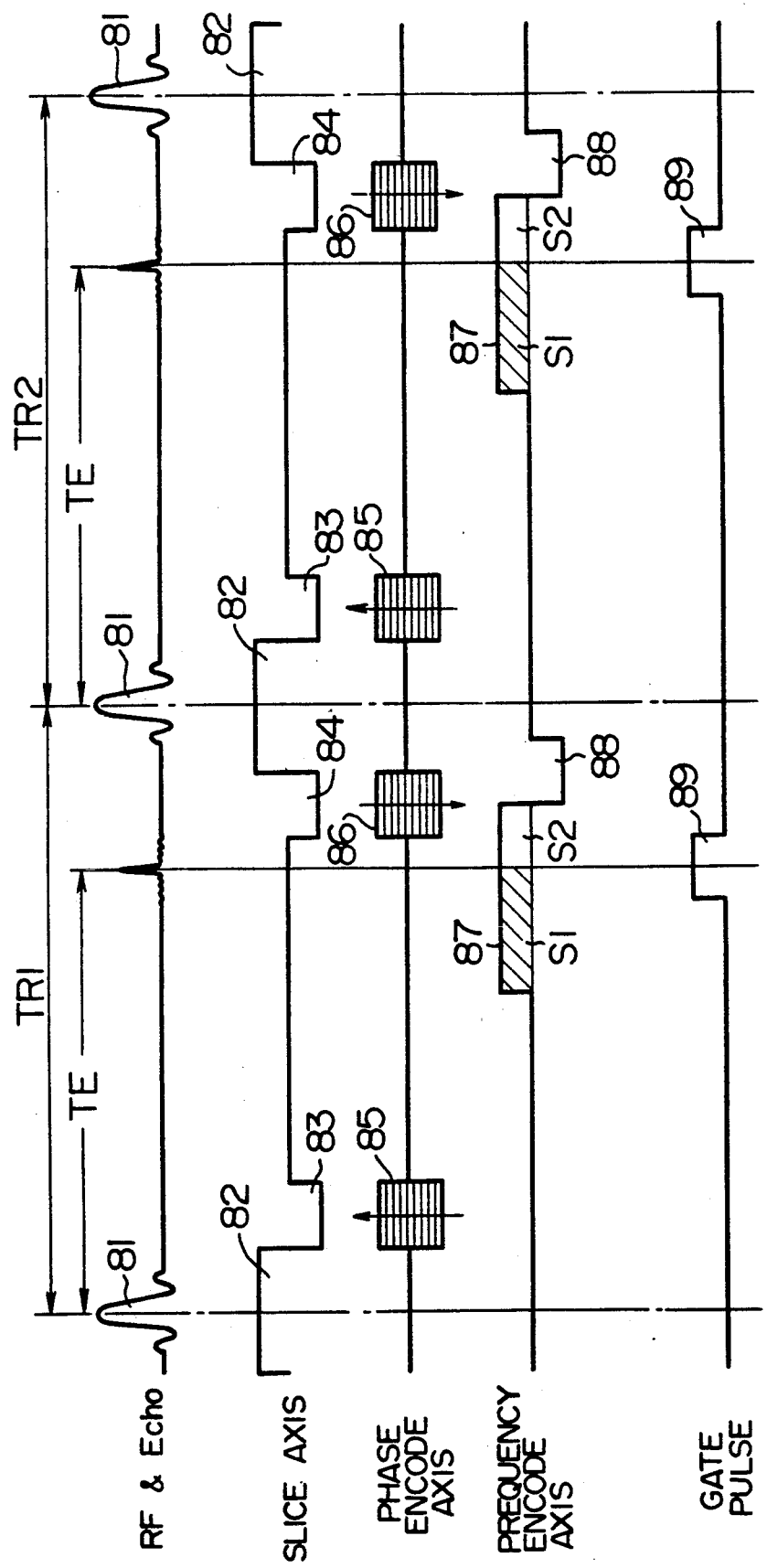
FIG. 9 shows the dephase sequence in the present invention.
Figure 10:
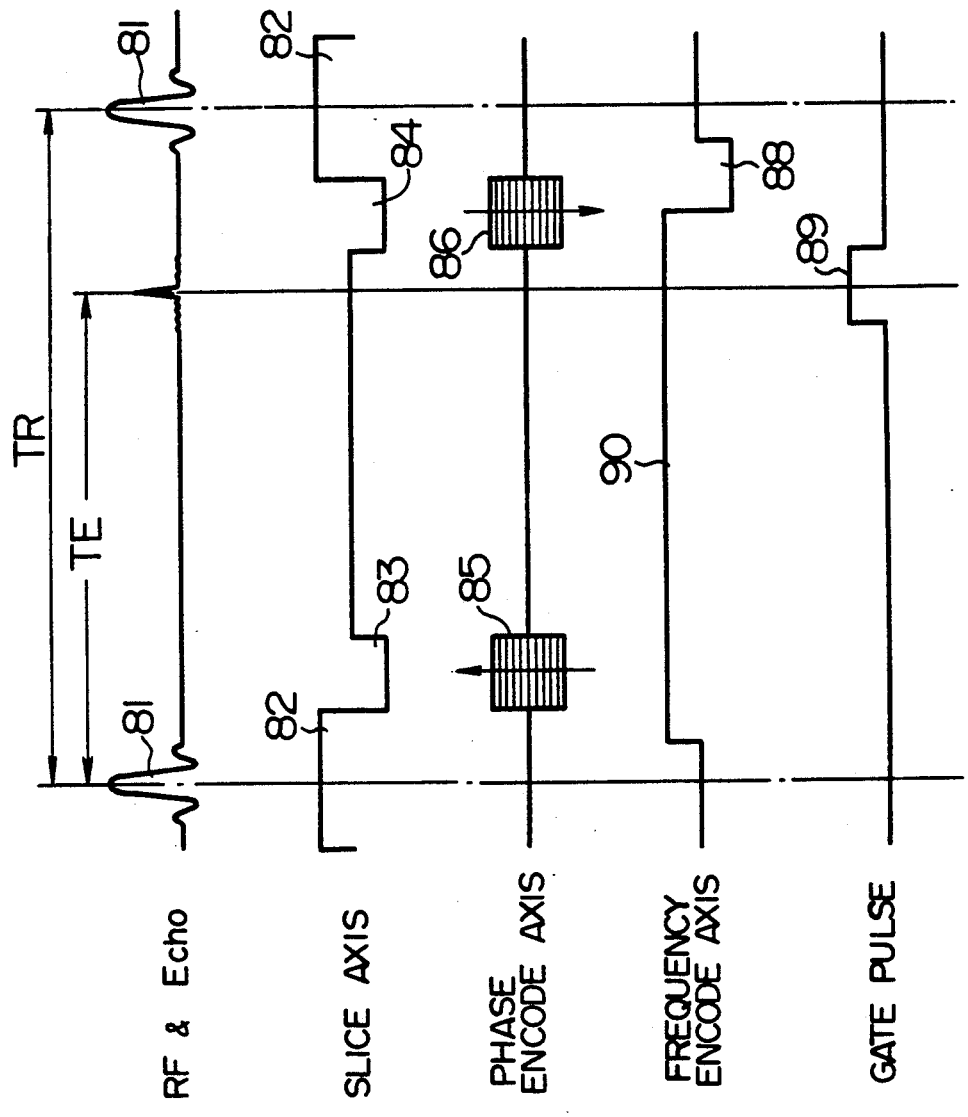
FIG. 10 shows a modification of the dephase sequence in the present invention, FIGS. 11A and 11B illustrated a principle of the modification of FIG. 10.

Embodiments of the gradient magnetic field pulse sequence to implement the present invention is shown in FIGS. 8, 9 and 10.

FIG. 8 shows the two-dimension rephase sequence for correcting the phase rotation of the fluid based on the signal which is immediately preceding to the RF pulse produced in the SSFP state and draw the fluid as a high signal intensity area. The repetition times TR1 and TR2 are equal (TR1=TR2) and the pulse sequences in the TR1 and TR2 the same.

An area to be imaged is selected by slicing 42 and it is excited by an RF pulse of any angle 41. It is excited with extremely short repetition times TR1 and TR2 compared to a relaxation time of the area to be imaged, and a signal produced immediately before the RF pulse is sampled as an echo signal by gradient magnetic fields 49, 50, 51, 52 and 53 and it is sampled by a gate pulse 54. Those are processed in the same phase encode projection 47 and 48. Pulses 43 and 44, and pulses 45 and 46 are applied to recover the phase disturbed along the slice direction in the slice selection, and pulses 42, 43 and 44 and pulses 45, 46 and 42 of TR2 form a rephase gradient magnetic field application pattern which renders the phase rotation of the fluid to zero. Pulses 49, 50, 51, 52 and 53 are applied to frequency-encode the signal and collect the each signal. Those pulses form a rephase gradient magnetic field pattern. A phase encode pulse 48 which is equal in the absolute value and opposite in the polarity to the pulse 47 is applied to reset the phase rotation of the spin after the sampling. The signal is measured while the phase encode projection of the pulses 47 and 48 is varied to reconfigure the image so that the fluid can be drawn as a high intensity signal area.

FIG. 9 shows a two-dimension dephase sequence which causes the phase rotation of the spin of the fluid from the signal which is immediately preceding to the RF pulse produced in the SSFP state and draws the fluid as a low intensity signal area. The repetition times TR1 and TR2 are same as those of FIG. 8.

Pulses 82, 83, 84 and 82 and 83 of TR2 form a dephase gradient magnetic field application pattern along the slice direction, and pulses 87 and 88 form a dephase gradient magnetic field application pattern along the frequency encode direction. S1 and S2 of the pulse 87 represent pulse area. S2 is equal to the area of the pulse 88. Since an RF pulse 81 of TR2 functions to invert the phase of the spin excited by the RF pulse 81 of TR1, the pulse 87 of TR2 functions as the opposite polarity pulse to the pulse 87 of TR1 for the excited spin. The pulse 87 of TR1 corresponds to the pulse 33 of FIG. 5B, and the pulse 87 of TR2 corresponds to the pulse 34 of FIG. 5B. As a result, the echo signal has a maximum peak when S1 of the pulse 87 of TR1 and S1 of the pulse 87 of TR2 are equal. It is sampled by a gate pulse 89. In general, the fluid having a low flow rate has small V in the formulas (1) and (2) and hence has small $\theta$ and a change in the signal intensity by a change in the phase for the static area is small. As a result, the sampling of the fluid is difficult to attain. However, since the time-reversed FID signal has TE which is double of TR, $\tau$ and $\tau_p$ in FIG. 5B are large accordingly.

In FIG. 9, $\tau$ and $\tau_p$ in the formula (2) are large in order to form the dephase gradient magnetic field application pattern in which the pulse 87 of TR1 and the pulse 87 of TR2 have large $\tau$ and $\tau_p$. As a result, the phase rotation $\theta$ is large and the change in the signal intensity for the static area is large. Thus, the sampling of the fluid having a low flow rate is easier.

FIG. 10 shows a two-dimension dephase sequence in which an area corresponding to the area $S_1$ of the pulse 87 of FIG. 9 is extended in time and a gradient magnetic field along the frequency encode direction is applied to maximize the phase rotation of the time-reversed FID signal.

The phase rotation of the time-reversed FID signal can be increased by increasing the integrated application amount of the pulse 90.

A principle of the embodiment of FIG. 10 is explained in FIGS. 11A and 11B.

In FIG. 11A, the application time of the pulse 90 is short. In this case, the phase rotation $\theta$ of the spin is given by $$\theta = \int_0^{4\tau} \gamma G_x X(t)dt = \int_0^{\tau} \gamma G_x(Xo + Vt)dt - \int_{3\tau}^{4\tau} \gamma G_x(Xo + vt) = -3\gamma G_x V\tau^2 \quad (4)$$

The definitions of the parameters are identical to those in the formula (1).

In FIG. 11B, the application time of the pulse 90 is long. The phase rotation $\theta$ of the spin is given by $$\theta = \int_0^{4\tau} \gamma G_x X(t)dt = \int_0^{2\tau} \gamma G_x(Xo + vt)dt - \int_{2\tau}^{4\tau} \gamma G_x(Xo + vt)dt = -4\gamma G_x \tau^2 \quad (5)$$

As seen from the formulas (4) and (5), the longer the application time of the pulse 90 is, the larger is the phase rotation. The pulse 90 may be extended up to the end time of the application of the RF pulse 81.

Figure 13:
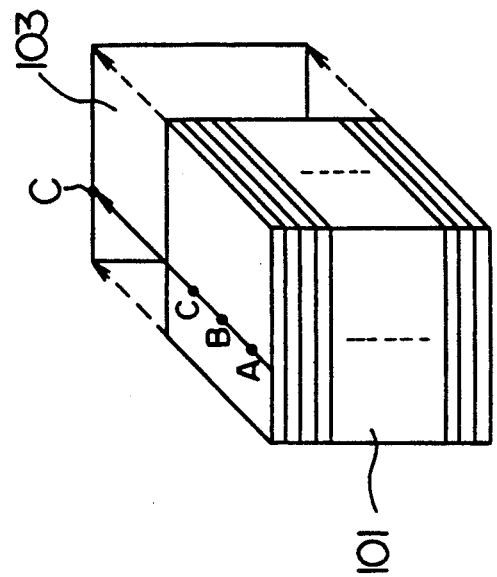
FIG. 13 illustrates a minimum intensity projection method.
Figure 12:
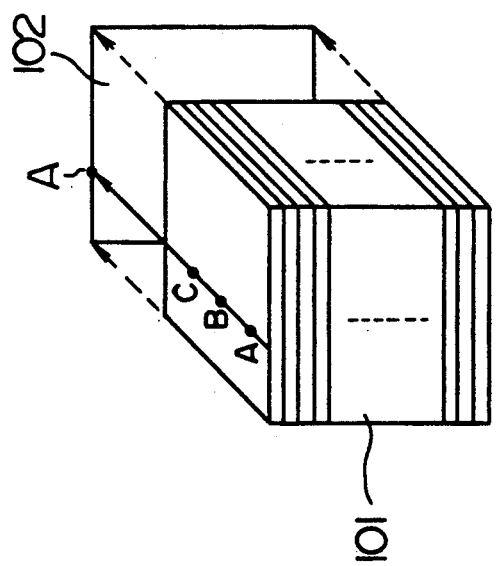
FIG. 12 illustrates a maximum intensity projection method.

FIGS. 12 and 13 illustrate a maximum intensity projection method and a minimum intensity projection method applied to the present invention.

When a two-dimension image is to be formed by projecting to any plane based on three-dimensionally measured data and three dimension image data by two-dimension multi-slice measurement, if the signal intensities A, B and C of the image data on the projection line of the source three-dimension image data 101 have a relationship of A>B>C, the signal of the fluid produced in the rephase sequence has a large intensity. Thus, the image data projected on the projection plane 102 uses the maximum intensity data "A" to prepare the projection image of the fluid. On the other hand, since the signal of the fluid produced in the dephase sequence is low, the image data projected on the projection plane 103 uses the minimum intensity data "C" to prepare the projection image of the fluid.

We claim:

1. An NMR imaging method for a low flow rate fluid comprising the steps of:
   (a) exciting spins in a fluid of a fluid portion of an object having fluid flow therein by applying a plurality of RF pulses to the object, each of the plurality of RF pulses being applied at intervals shorter than a relaxation time of an excited spin in order to cause a steady-state free precession in which a free induction decay (FID) signal occurring immediately after an application of one of said plurality of RF pulses and a time-reversed FID signal occurring immediately preceding application of the next one of said plurality of RF pulses are generated;
   (b) applying a gradient magnetic field to the fluid portion along a direction of fluid flow for controlling a phase rotation of spins in said excited fluid;
   (c) measuring said time-reversed FID signal; and
   (d) constructing an image of said fluid by projecting three-dimensional data obtained from said measured time-reversed FID signal.

2. An NMR imaging method for a low flow rate fluid according to claim 1, wherein the plurality of RF pulses are repeatedly applied in an interval shorter than a spin-lattice relaxation time and a spin to spin relaxation time of the excited spin, the step of constructing an image including projecting three-dimensional data obtained from said measured time-reversed FID signal on a plane.

3. An NMR imaging method for a low flow rate fluid according to claim 1 wherein said step of controlling said phase rotation includes a step of applying said gradient magnetic field such that said phase rotation is caused in said excited spin.

4. An NMR imaging method for a low flow rate fluid according to claim 3, wherein said step of controlling the phase rotation includes a step of applying said gradient magnetic field such that the phase rotation is maximized.

5. An NMR imaging method for a low flow rate fluid according to claim 4, wherein said step of applying the gradient magnetic field to maximize the phase rotation includes a step of applying a frequency-encoded pulse from the end time of the application of said one of said plurality of RF pulses.

6. An NMR imaging method for a low flow rate fluid according to claim 3, wherein said step of measuring the time-reversed FID signal includes a step of widening a slice width to produce three-dimensional image data or a step of measuring as two-dimensional multi-slice data to produce three-dimensional image data, and
   said step of constructing an image includes a step of projecting a pixel having a minimum signal intensity of a plurality of pixels on a projection line of said three-dimensional image data to form the image of said fluid.

7. An NMR imaging method for a low flow rate fluid according to claim 1 wherein said step of controlling the phase rotation includes a step of applying the gradient magnetic field so that the phase rotation is not caused in said excited spin.

8. An NMR imaging method for a low flow rate fluid according to claim 7, wherein said step of measuring the time-reversed FID signal includes a step of widening the slice width to produce three-dimensional image data or a step of measuring as two-dimensional multi-slice data to produce three-dimensional image data, and
   said step or constructing an image includes a step of projecting a pixel having a maximum signal intensity of a plurality of signals on a projection line of the three-dimensional image data to form the image of said fluid.

9. An NMR imaging method for a low flow rate fluid according to claim 1, wherein said step of controlling the phase rotation includes:
   a step of applying the gradient magnetic field such that the phase rotation is caused in said excited spin, and
   a step of applying the gradient magnetic field such that the phase rotation is not caused,
   said step of measuring the time-reversed FID signal includes a step of measuring the phase-rotated signal and non-phase rotated signal, and
   said step of constructing an image includes a step of subtracting between images derived from the phase-rotated signal and the non-phase-rotated signal to extract the image data of said fluid.

* * * * *